United States Patent
Steeneken

(10) Patent No.: US 8,149,076 B2
(45) Date of Patent: Apr. 3, 2012

(54) MEMS DEVICE WITH CONTROLLED ELECTRODE OFF-STATE POSITION

(75) Inventor: Peter G. Steeneken, Valkenswaard (NL)

(73) Assignee: NXP B.V., Eindhoven (NL)

( * ) Notice: Subject to any disclaimer, the term of this patent is extended or adjusted under 35 U.S.C. 154(b) by 88 days.

(21) Appl. No.: 12/518,690

(22) PCT Filed: Dec. 10, 2007

(86) PCT No.: PCT/IB2007/054989
§ 371 (c)(1),
(2), (4) Date: Jun. 11, 2009

(87) PCT Pub. No.: WO2008/072163
PCT Pub. Date: Jun. 19, 2008

(65) Prior Publication Data
US 2010/0025206 A1  Feb. 4, 2010

(30) Foreign Application Priority Data
Dec. 12, 2006  (EP) .................................. 06125882

(51) Int. Cl.
*H01H 51/22* (2006.01)
(52) U.S. Cl. .................................. 335/78; 200/181
(58) Field of Classification Search .................. 335/78; 200/181
See application file for complete search history.

(56) References Cited

U.S. PATENT DOCUMENTS

| | | | |
|---|---|---|---|
| 5,289,172 A | 2/1994 | Gale, Jr. et al. | |
| 5,679,436 A | 10/1997 | Zhao | |
| 6,057,520 A * | 5/2000 | Goodwin-Johansson | 200/181 |
| 6,127,908 A * | 10/2000 | Bozler et al. | 333/246 |
| 6,204,085 B1 | 3/2001 | Strumpell et al. | |
| 6,261,494 B1 | 7/2001 | Zavracky et al. | |
| 6,396,372 B1 * | 5/2002 | Sakata et al. | 335/80 |
| 6,718,764 B1 | 4/2004 | Sarkar et al. | |
| 7,053,737 B2 * | 5/2006 | Schwartz et al. | 335/78 |
| 7,342,472 B2 * | 3/2008 | Charvet | 335/78 |
| 7,453,339 B2 * | 11/2008 | Fork et al. | 335/78 |
| 7,936,240 B2 * | 5/2011 | Lee et al. | 335/78 |
| 2002/0191897 A1* | 12/2002 | Hallbjorner et al. | 385/18 |
| 2003/0227361 A1* | 12/2003 | Dickens et al. | 335/78 |
| 2004/0119126 A1 | 6/2004 | Chen et al. | |

(Continued)

FOREIGN PATENT DOCUMENTS

| | | |
|---|---|---|
| EP | 1526399 A1 | 4/2005 |
| JP | 06-258586 A | 9/1994 |
| JP | 11-119129 A | 4/1999 |
| JP | 11-211482 A | 8/1999 |

OTHER PUBLICATIONS

Majumder, S., et al; "Adhesion and Contact Resistance in an Electrostatic MEMS Microswitch"; 18th IEEE International Conference on Micro Electro Mechanical Systems, Jan. 30-Feb. 3, 2005; Miami Beach, FL, USA.

(Continued)

*Primary Examiner* — Bernard Rojas

(57) ABSTRACT

The present invention relates to MEMS device that comprises a first electrode, and a second electrode suspended with a distance to the first electrode with the aid of a suspension structure. The MEMS device further comprises at least one deformation electrode. The second electrode or the suspension structure or both are plastically deformable upon application of an electrostatic deformation force via the deformation electrode. This way, variations in the off-state position of the second electrode that occur during fabrication of different devices or during operation of a single device can be eliminated.

18 Claims, 7 Drawing Sheets

U.S. PATENT DOCUMENTS

2004/0121510 A1* 6/2004 Seki et al. .................... 438/100
2004/0245871 A1   12/2004 Kim et al.
2004/0263297 A1* 12/2004 Glukh et al. ................. 335/207
2005/0099252 A1*  5/2005 Isobe et al. .................... 335/78
2005/0162806 A1   7/2005 Sarkar et al.
2007/0001248 A1*  1/2007 Geisberger et al. ........... 257/414
2011/0287586 A1* 11/2011 Schirmer et al. .............. 438/121

OTHER PUBLICATIONS

Fukuta, Y. "Microactuated Self-Assembling of 3D Polysilicon Structures with Reshaping Technology," Proc. IEEE 10th Annual Int'l. Workshop on Micro Electro Mechanical Systems, pp. 477-481 (Jan. 1997).

* cited by examiner

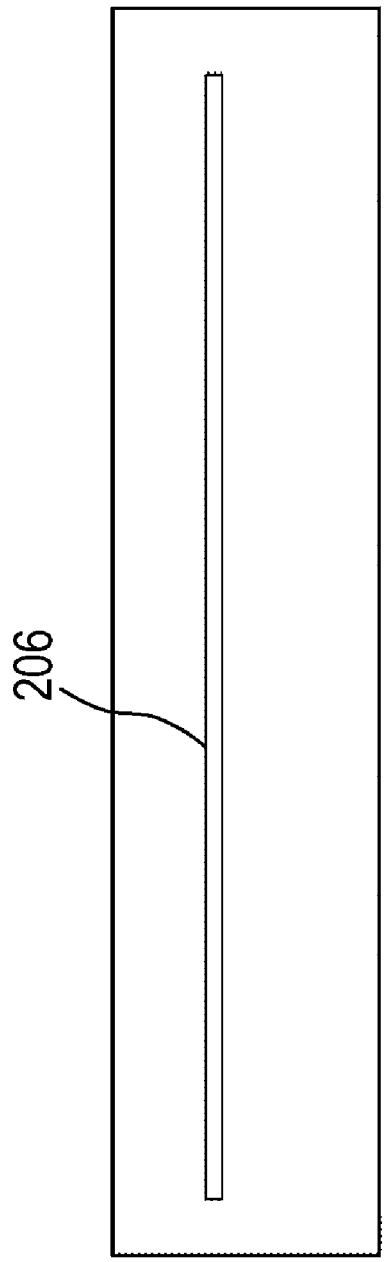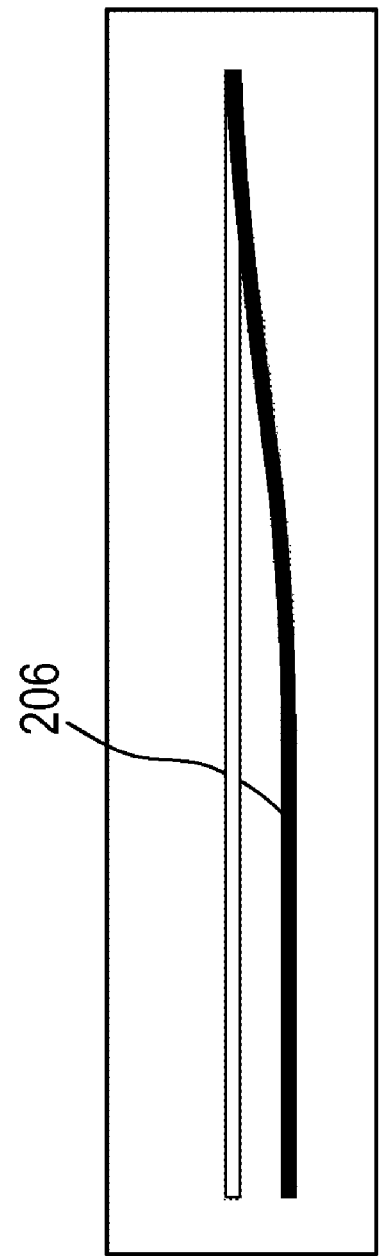
FIG. 2
FIG. 3

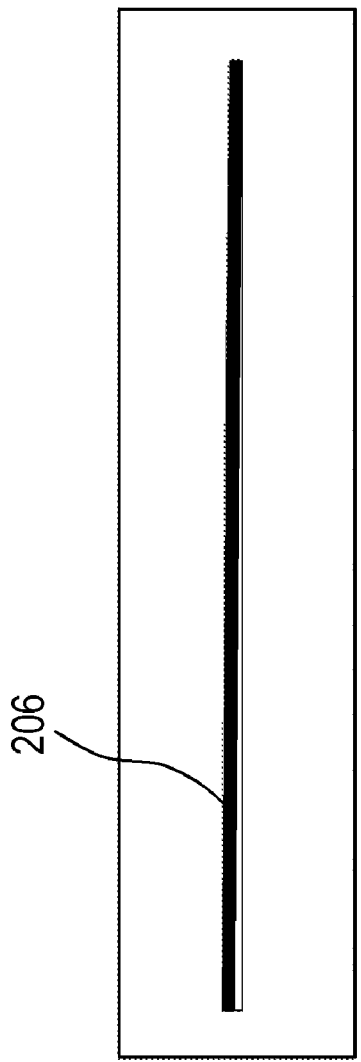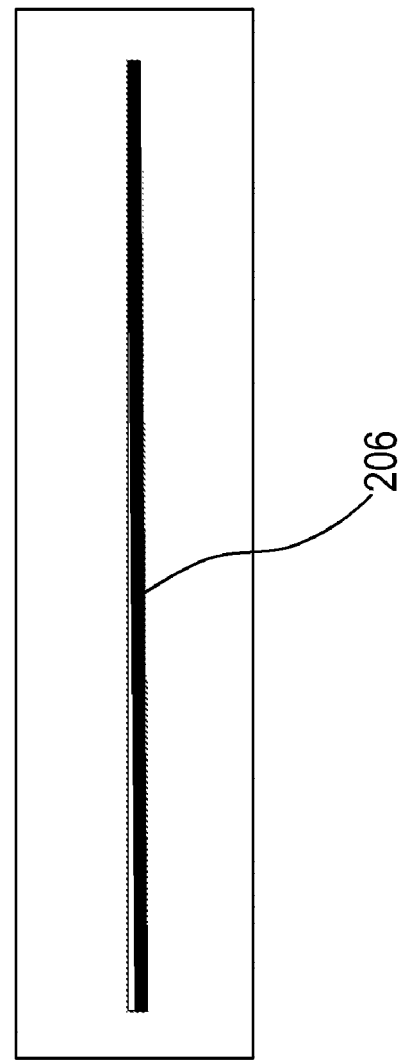
FIG. 7
FIG. 8

MEMS DEVICE WITH CONTROLLED ELECTRODE OFF-STATE POSITION

FIELD OF THE INVENTION

The present invention relates to a microelectric-mechanical-system device, hereinafter MEMS device. It further relates to an electronic device comprising a MEMS device connected with an integrated circuit, a method for fabricating a MEMS device, and a method for operating an electronic device comprising a MEMS device connected with an integrated circuit.

BACKGROUND OF THE INVENTION

US 2005/0162806 A1 describes a MEMS device for operation at radio frequency (RF). The MEMS device comprises a first electrode and a deformable second electrode. The second electrode is plastically deformable via exposure to thermal energy. This way, an electrical characteristic of the MEMS device can be tuned. The deformable second electrode is also elastically deformable for tuning the electrical characteristic.

During the production of MEMS devices, stresses in the suspended second electrode can occur, which result in an usually undesired plastic deformation of the second electrode. One reason for such undesired stress and plastic deformation is, among others, a difference in thermal expansion coefficients of the MEMS device and of a substrate of the MEMS device. The stress is then caused by high-temperature steps during the fabrication or packaging process. Stress can also be exerted by layers of different materials, which are in contact with the MEMS device and which have different levels of stress after deposition. Stress has also been observed to be caused by capillary forces that are generated during the drying of the MEMS device after a wet processing step during fabrication. Also, stress can be caused by a flow of a liquid or gas along the second electrode.

During operation of MEMS devices, stress can occur as a result of high actuation forces or contact forces on the device, thermal cycling in the presence of different thermal extension coefficients of the MEMS device and its substrate, or as a result of creep. Creep is known as a tendency of materials to plastically deform for relieving stress that is applied over a long period of time at levels that are below the yield stress level. The yield stress level is the stress level, at which a material begins to plastically deform. Plastic deformation is a non-reversible change of shape in response to an applied force.

SUMMARY OF THE INVENTION

According to a first aspect of the invention, a MEMS device is provided that comprises:
a first electrode,
a second electrode, which in an off-state position, in which no switching force is applied to the second electrode, is suspended with a distance to the first electrode with the aid of a suspension structure, and which is elastically switchable to an on-state position upon application of a switching force via the first electrode, and
at least one deformation electrode.
Either the second electrode or the suspension structure or both, the second electrode and the suspension electrode, are plastically deformable upon application of an electrostatic deformation force via the at least one deformation electrode to either the second electrode or to the suspension structure or to the second electrode and to the suspension structure.

Undesired plastic deformation of the second electrode of the MEMS device results in a change of an open capacitance, which is also referred to as the off-state capacitance herein. The off-state capacitance depends on the distance between the first and second electrodes. Since a plastic deformation of the second electrode changes the distance between the first and second electrodes, it therefore changes the open capacitance of the MEMS device. Also, the voltage required to elastically pull in and release, i.e., elastically switch the second electrode, may differ from a desired target value in the presence of an undesired plastic deformation of the second electrode. The term "elastical switching" thus refers to typical pull-in and release motions of the second electrode during operation which do not change the off-state position of the second electrode.

A small deformation after the fabrication of the MEMS device is usually not problematic. However, small variations in the fabrication process can result in large variations between different MEMS devices of the same design, e.g., on the same wafer, or on different wafers.

The MEMS device of the first aspect of the invention overcomes such variations by providing at least one deformation electrode and a structure, in which either the second electrode or the suspension structure for the second electrode or both are plastically deformable upon application of an electrostatic deformation force via the at least one deformation electrode to either the second electrode or to the suspension structure or to both of them. Thus, in the MEMS device of the present invention, a tuning of the off-state position of the second electrode is enabled by means of an electrostatic force that effects a plastic deformation of the second electrode.

This provides an advantageous alternative technology to a MEMS device, in which a plastic deformation of the second electrode is achieved by applying thermal energy, as described in US 2005/0162806 A1. An electrostatic force for plastic deformation of the second electrode can be controlled with better precision. Therefore, a higher accuracy of the plastic deformation can be achieved in the MEMS device of the present invention. In particular, the duration of the application of the electrostatic deformation force via the at least one deformation electrode can be controlled with very high precision because electrical switching can be performed very fast within nanoseconds or even picoseconds. In contrast, the application of thermal energy involves time constants, which are much longer and are therefore more difficult to control. A second advantage of the electrostatic force for plastic deformation of the second electrode is that it consumes much less energy than deformation using thermal energy.

The MEMS device of the present invention also achieves the further advantage over that known from US 2005/0162806 A1 that it allows using a simple structure for second electrode. Where US 2005/0162806 A1 necessarily requires a second electrode, which is made from a layer sequence with layers of different coefficients of thermal expansion, in order to achieve the desired plastic deformation upon application of thermal energy, this is not a requirement in the MEMS device of the present invention. This will be further elucidated in the context of the description of embodiments further below.

In the following, embodiments of the MEMS device of the first aspect of the invention will be described. Unless stated otherwise explicitly, the embodiments can be combined with each other.

In one embodiment, the suspension structure comprises at least one spring. The at least one spring is plastically deformable upon application of the deformation force via the at least one deformation electrode. Concentrating the plastic deformation on the suspension structure allows applying a rather low electrostatic force for achieving the plastic deformation. Preferably, the spring is mechanically fixed to the substrate by an anchor.

Furthermore, in an embodiment that uses more than one spring in the suspension structure, the number of springs preferably corresponds to a number of deformation electrodes. The springs and the deformation electrodes of this embodiment are arranged relative to each other in a one-to-one configuration to allow precisely controlling the deformation of each of the springs by a respective allocated deformation electrode. The position of the deformation electrodes is chosen so as to allow plastically deforming a respective spring by application of a suitable electrostatic force.

A desired deformation force amount can be set by the application of a suitable voltage to the deformation electrode. In an alternative embodiment the desired deformation force amount can be set by accurate design of the position and size of the deformation electrode. In this case the deformation will not depend on the voltage on the deformation electrode after the voltage exceeds a particular value. The advantage of this embodiment is that less accurate voltage control is required.

The plastic deformability of the second electrode or of the suspension electrode upon application of an electrostatic deformation force via at least one deformation electrode implies the use of a material that is deformable upon application of electrostatic force. A suitable material for the suspension structure, and, in particular, for the springs, is aluminum Al. Aluminum has a relatively low yield stress value. It can thus be easily deformed plastically. Furthermore, aluminum has a high electrical conductivity. Also alloys of aluminum with other materials, for example AlCu alloys with 0-10 weight percent copper, have these favorable properties.

In another embodiment, a metal different from aluminum is used. The metal can be chosen according to a desired yield-stress value, and according to a desired electrical conductivity. Also, alloys of different metals can be used for the suspension structure, in particular, for the springs. Other suitable materials are known to a person of ordinary skill in the art. Examples are Cu, Ni, Au, and Ag.

A further embodiment of the MEMS device of the first aspect of the invention comprises a dielectric arranged between the first and second electrodes. By providing a dielectric between the first and second electrodes, the capacitance of the MEMS device can be increased in comparison with an embodiment that only uses an air gap between the first and second electrodes. For the capacitance increases with a material-specific dielectric constant of the dielectric material if it is larger than that of air, i.e., larger than approximately 1. This can be particularly useful for a MEMS varicap. Moreover, the dielectric can prevent the first and second electrode from touching each other. The dielectric prevents DC currents from running, but will transmit high frequency RF currents. This is necessary to maintain the DC actuation voltage between the electrodes in the closed state.

The dielectric can for instance be a dielectric layer. In one embodiment, the dielectric layer is deposited on the first electrode. In this embodiment, the second electrode is preferably elastically deformable between its off-state position at a distance to the dielectric layer and an on-state position that is in direct contact with the dielectric layer. An on-state position in direct contact with the dielectric allows achieving the maximum possible capacitance in the on-state for a given MEMS structure. In another embodiment the dielectric layer is deposited both on the first electrode and on the deformation electrode. Similarly the dielectric can prevent DC current flow between the suspension structure and the deformation electrode.

The second electrode of the MEMS device of the first aspect of the present invention can be made of a single layer in some embodiments. Note that a single-layer structure is an advantageous option but not a requirement in the MEMS device of the present invention. A single-layer structure is advantageous, because it easier to manufacture and because it is less sensitive to elastic or plastic deformations during device operation as a result of ambient temperature changes during operation.

In one embodiment, the second electrode is additionally deformable by exposure to thermal energy. In this embodiment, a combination of thermal energy and electrical energy can be used to achieve a desired deformation. For instance, a base amount of mechanical stress below the yield-stress amount of the second electrode can be provided by applying thermal energy. An additional stress amount can then be applied as an electrostatic force via the deformation electrode, thus exceeding the yield-stress amount only when both forces are applied at the same time. This way, the advantages of a plastic deformation of the second electrode by application of an electrostatic force, which have been described above, are preserved. This embodiment has the further advantage that an exposure of the second electrode to thermal energy can be used to lower its yield stress. For the yield stress of metals is usually lower at higher temperatures. If the second electrode is then simultaneously subjected to an electrostatic force, less electrostatic force is needed to exceed the yield stress.

Details of how to achieve a plastic deformation by exposing the second electrode to thermal energy can be found in US 2005/0162806 A1, which is incorporated herein by reference. In particular, a layered structure of the second electrode with different material layers of different coefficients of thermal expansion is useful. Heating of the second electrode can for instance be performed by applying electrical current or current pulses to the second electrode.

In one embodiment, at least one of the deformation electrodes is identical with the first electrode. In other words, the first electrode and the deformation electrode form one part. Alternatively, the at least one deformation electrode is in direct electrical connection with the first electrode. In this embodiment, care should be taken that actuation voltage for generating the switching force does not result in a plastic deformation. The yield stress of the second electrode should be reached only upon application of a much higher voltage than the actuation voltage for applying the switching force.

In contrast, in embodiments, which have one or more deformation electrodes, which are separate from the first electrode, the deformation voltage can also be chosen of the same order of magnitude as the actuation voltage for applying the switching force, which voltage is also referred to as the operation voltage herein. This is favorable to decrease charge injection or break down, which may occur at high voltages.

Note that because the electrostatic force applied is always attractive, the method is, without further measures, not suitable to decrease the capacitance nor to increase the pull-in voltage. To tackle this problem, one embodiment has one or more protrusions, which reach into a clearance, in other words, into a space that is present below a respective suspension structure and between the suspension structure and the deformation electrode. The protrusions are in one embodiment placed on the bottom of the suspension structures. In an embodiment, where a dielectric layer is present, the protrusions can reach into a space between the dielectric layer and the suspension structures.

The function of the protrusion or protrusions in the present context is as follows: if a suitable deformation voltage is applied to the deformation electrodes, the suspension structures will first touch the protrusions. If the deformation voltage is increased even more, the suspension structures will bend around or between the protrusions and will eventually deform. By choosing a suitable position and geometry of the suspension structures and the protrusions, the suspension structures can be bent in suitable directions to decrease the capacitance or to increase the pull-in-voltage. Therefore, even though the electrostatic force is always attractive, this method allows to control a decrease of the open capacitance and an increase of the pull-in voltage by means of applying a suitable deformation voltage to the deformation electrodes. This can be used to cancel effects of capacitance increase during operation, heating, or processing.

This structure is in one embodiment be used to provide adjusting capabilities of the capacitance and pull-in-voltage in two directions, toward higher and lower values. In a deformation-voltage interval that is lower than a threshold voltage, at which the protrusions become effective, the capacitance can be increased. Above the threshold of the deformation voltage, the capacitance can be decreased.

According to a second aspect of the invention, an electronic device is provided that contains a MEMS device according to the first aspect of the invention or one of its embodiments in connection with an integrated circuit.

The advantages of the electronic device of the second aspect correspond to those of the MEMS device of the first aspect of the invention.

In the following, embodiments of the electronic device will be described. As before, embodiments can be combined with each other unless stated otherwise explicitly.

In one embodiment, the electronic device of the second aspect of the invention comprises a deformation-control unit. The deformation-control unit is connected with the first electrode and configured to generate and provide the deformation voltage to the at least one deformation electrode. This embodiment allows tuning the off-state position of the second electrode also during operation of the electronic device. Therefore, undesired deformations, which may occur during operation of the electronic device, for instance due to thermal cycles, can be corrected. The electronic device therefore has a MEMS device with precisely controlled and reliable electric parameters such as the off-state (or open) capacitance and the pull-in voltage.

In another embodiment, which can be provided as an alternative or in addition to the embodiment of the foregoing paragraph with a deformation-control unit, the electronic device comprises a deformation-control unit, which is connected with the first electrode and the second electrode and configured to ascertain a value of a first quantity that is dependent on the off-state capacitance of the arrangement formed by the first and second electrodes in the off-state. This embodiment has the advantage that the amount of plastic deformation, which is required can be determined with high precision on the basis of the ascertained value of the first quantity. In one embodiment, the deformation-control unit of the electronic device is configured to communicate the ascertained value of the first quantity to an external tuning device. In another embodiment, the deformation-control unit is configured to provide the ascertained value of the first quantity internally. The electronic device of this embodiment therefore forms a combination with that of the previous paragraph.

Ascertaining a value of the first quantity and tuning the off-state position of the second electrode allows necessary adjustments without having to use extra tools in the form of devices external to the electronic device. Note, however, that it is also possible to do without ascertaining the off-state capacitance. For certain applications, it is sufficient to reset the off-state position of the second electrode. It will be shown during the discussion of FIGS. 7 to 9 further below that the application of a suitable deformation voltage leads to a deformation of the second electrode to a certain off-state position that is independent of its previous off-state position.

In a further embodiment, the deformation-control unit is configured to set the deformation voltage in proportion to a difference between a target value of the first quantity and the ascertained value of the first quantity. To this end, the deformation-control unit could for instance contain an oscillator circuit that contains the MEMS device as a capacitance, and which in resonance at a desired or target value of the first quantity. In this example, the deformation voltage can be tuned on the basis of an output signal amplitude of the oscillator, and attain a larger value, when the output signal amplitude of the ring oscillator is low in comparison with the maximum output signal amplitude that occurs during resonance.

The MEMS device forms a part of a functional module, other parameter might also be used as a feedback for the deformation process. For example, in a power-amplifier front-end, the output power efficiency could be optimized by applying a suitable deformation voltage.

Since undesired deformations may be caused in a packaging process, it is useful in one embodiment to provide the electronic device with at least one deformation-control contact element, which is connected with the at least one deformation electrode for connecting the deformation electrode with an external tuning device. This way, variations and spread between different electronic devices according to the second aspect of the invention can be eliminated by a very simply procedure after packaging.

If more detailed information is desired before the application of a deformation voltage by an external tuning device, the electronic device can be equipped with two capacitance-measurement contact elements. The capacitance-measurement contact elements are connected with the first electrode and the second electrode respectively, and serve for connecting them with an external measurement device for ascertaining a first quantity that is dependent on an off-state capacitance of an arrangement formed by the first and second electrodes in the off-state.

According to a third aspect of the invention, a tuning device is provided for tuning an off-state position of a suspended electrode of a MEMS device. The tuning device comprises a deformation control unit, which is configured to generate a predetermined deformation voltage. The tuning device further contains an output unit, which is configured to provide the deformation voltage to an external deformation-control contact element of a MEMS device.

The tuning device of the present aspect of the invention is useful for eliminating variations and spread that may occur during fabrication and packaging of electronic devices or MEMS devices according to the previous aspects of the invention.

In one embodiment, the tuning device comprises a measurement unit configured to ascertain a value of a first quantity that is dependent on an off-state capacitance of an arrangement formed by a first and a second electrode of an external MEMS device in the off-state positions.

According to a fourth aspect of the invention, a method for fabricating the MEMS device of claim 1 or one of its embodiments comprises the step of applying a deformation voltage to the at least one deformation electrode, thus plastically forming the second electrode, until the second electrode reaches a target off-state position. The method of the present aspect of the invention allows reducing or eliminating variations and spread between different MEMS devices during fabrication.

In different embodiments, the step of applying the deformation voltage is performed either before or after a step of packaging the MEMS device. Where the thermal load of the packaging step is low enough, the deformation voltage can be applied before the packaging step. In this embodiment, the MEMS device need not be provided with a deformation-control contact element, which helps keeping the number of contact elements like pins or pads in the packaged device low. However, where the thermal stress during the packaging step could lead to an undesired deformation or to spread of the off-state positions in different MEMS devices, it is preferred to apply the deformation voltage after the packaging.

In one embodiment, a step of ascertaining a current value of a first quantity that is dependent on an off-state capacitance of the arrangement formed by the first and second electrodes of the MEMS device in their off-state positions is performed before applying the deformation voltage.

According to a fifth aspect of the present invention, a method is provided for operating the electronic device of the second aspect of the present invention. The method comprises the step of applying a deformation voltage to the at least one deformation electrode, thus plastically deforming the second electrode of the MEMS device comprised by the electronic device until a target value of the first quantity is reached.

The method of the fifth aspect of the present invention allows resetting or tuning the off-state position of the second electrode in accordance with a desired open capacitance or pull-in voltage of the MEMS device.

In one embodiment, the method for operating the electronic device comprises ascertaining a current value of a first quantity that is dependent on an off-state capacitance of the arrangement formed by the first and second electrodes of the MEMS device in their off-state positions. This embodiment provides for testing of the MEMS device in order to ascertain whether the application of the deformation voltage is necessary. It also allows to determine a most suitable value of the deformation voltage to be applied.

In one embodiment, the deformation voltage is generated and applied to the deformation electrode by an external voltage source.

In another embodiment, the deformation voltage is generated and applied to the deformation electrode by a voltage source comprised in the electronic device.

Embodiments of the invention are also defined in the dependent claims. It shall be understood that the MEMS device of claim 1 and the electronic device of claim 11 have similar and/or identical embodiments as defined in the dependent claims.

BRIEF DESCRIPTION OF THE DRAWINGS

The invention will now be explained in more detail with reference to the drawings in which:

FIGS. 2 to 4 show, as a proof of concept the result of finite element simulation of an electrostatically actuated double claimed beam at different states.

FIGS. 7 and 8 show another proof of concept the result of finite element simulation of an electrostatically actuated double claimed beam at different states;

DETAILED DESCRIPTION OF EMBODIMENTS

Figure 1:
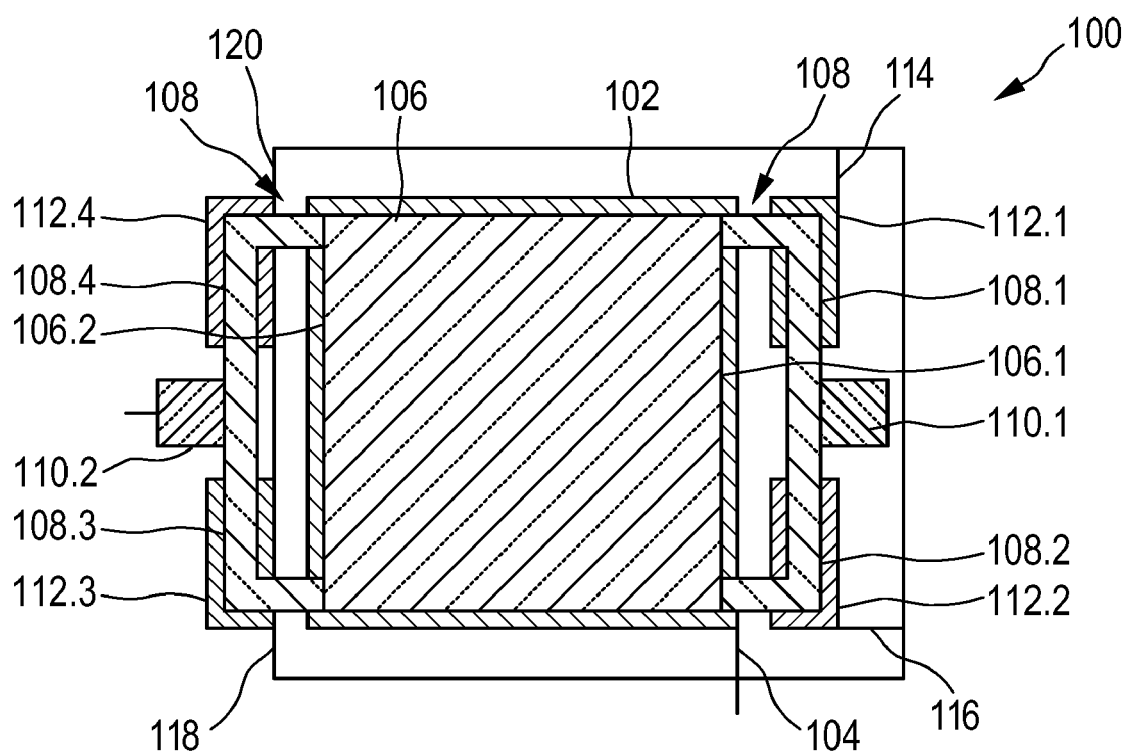
FIG. 1 shows a schematic top view of a MEMS device according to an embodiment of the invention.

FIG. 1 shows a schematic top view of a MEMS device 100 according to an embodiment of the invention. The MEMS device is arranged on a substrate (not shown). The MEMS device 100 comprises a first electrode 102, which is arranged on the substrate. The first electrode is also referred to as the bottom electrode herein. The bottom electrode 102 is connectable to an internal or external multiage source for application of a switching voltage via a switching line 104. A second electrode 106, herein also referred as the top electrode, is arranged over the bottom electrode 102. the top electrode 106 is suspended with a distance to the bottom electrode with the aid of a suspension structure 108, which comprises four springs 108.1 to 108.4. The four springs are formed by two U-shaped aluminum sheets, which are arranged on opposing lateral sides 106.1 and 106.2 of the top electrode 106. The bottom of the U is supported by respective anchor structures 110.1 and 110.2. The anchor structures 110.1 and 110.2 are made of aluminum as well. They are arranged approximately in the center of the lateral extension of the first electrode, which equals the lateral extension of the U-shaped suspension structures.

The U-shape of the suspension structures 108 is more specifically a rectangular U-shape. They attached to the top electrode 106 with their top sides. Note that the top electrode, the suspension structures 108 and the anchors 110.1 and 110.2 can be fabricated in one piece. The MEMS device further has four deformation electrodes 112.1 to 112.4, which are arranged underneath the respective corner sections of the four springs 108.1 to 108.4. The deformation electrodes 112.1 to 112.4 are arranged on the substrate with a lateral distance to the bottom electrode 102. A deformation voltage can be applied to the deformation electrodes 112.1 to 112.4 via corresponding deformation-control lines 114, 116, 118, and 120. In the present embodiment, all deformation-control lines are operated in parallel with the same voltage and thus connected with each other. In another embodiment, the deformation-control lines are operated independently from each other, and thus not connected with each other.

The bottom electrode 102 and the top electrode 106 have lateral shape of a square. The bottom electrode is in the present embodiment covered with a dielectric layer (not shown). Note that the presence of the dielectric layer is not a requirement. It can be omitted depending on the desired application.

Upon application of a switching voltage to the bottom electrode 102 via the switching line 104, an attractive electrostatic switching force is exerted to the top electrode 106. Due to the elastically deformable suspension by the four springs 108.1 to 108.4, the top electrode 106 is able to move towards the bottom electrode. The attractive force between the bottom and top electrodes causes a reversible elastic deformation of the four springs 108.1 to 108.4, which are coupled to the top electrode.

As long as no switching voltage is applied to the bottom electrode 102, the top electrode 106 remains in an off-state position at a certain distance to the bottom electrode 102. The off-state position of the top electrode 106 determines an off-state capacitance, also referred to as open capacitance of the MEMS device, as is well known, the capacitance of a plate capacitor is proportional to the inverse of the distance between the plates. In the present case, the plates correspond to the top and bottom electrodes 106 and 102, respectively. The off-state position of the top electrode 106 with respect to the bottom electrode 102 also determines a pull-in voltage of the MEMS device. The pull-in voltage can be described as the minimum voltage that has to be applied for bringing the top electrode 106 in contact with the dielectric layer on top of the bottom electrode 102. This description applies if the voltage is increased slowly from zero upward. If the voltage is applied very quickly, e.g. as a step function, the switch might already close at a voltage which is lower than the pull-in voltage as described above.

As explained earlier within the present specification, the off-state position of the top electrode 106 with respect to the bottom electrode 102, i.e. the distance between the two electrodes, may vary between different MEMS devices due to small process variations during fabrication. It also may vary in a single device over time due to different effects during operation, such as high actuation or contact forces on the device, high-speed impact, thermal cycling in the presence of mismatch of the coefficient of thermal expansion in different structural elements of the device, and due to creep. Such undesired variations of the off-state position of the top electrode 106 can be corrected or eliminated by applying a suitable deformation voltage to the deformation electrodes 112.1 to 112.4. This will be explained in more detail in the following with reference to FIGS. 2 to 9.

Figure 6:
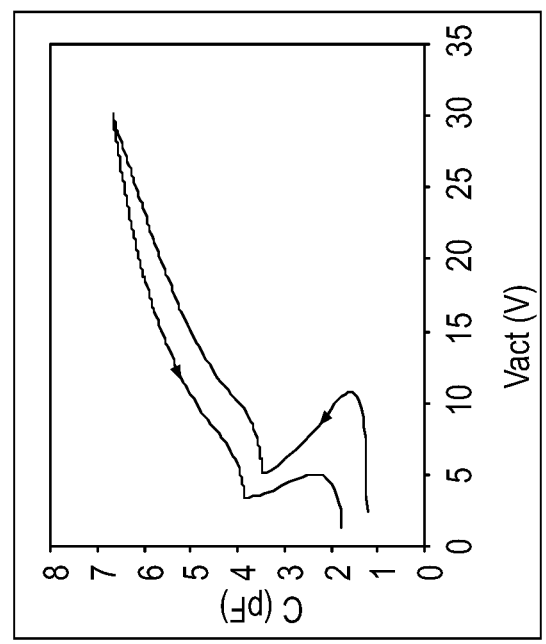
FIGS. 5 and 6 are diagrams showing the dependence of the capacitance of a MEMS device on a voltage applied to a deformation electrode in the configuration of FIGS. 2 to 4.
Figure 4:
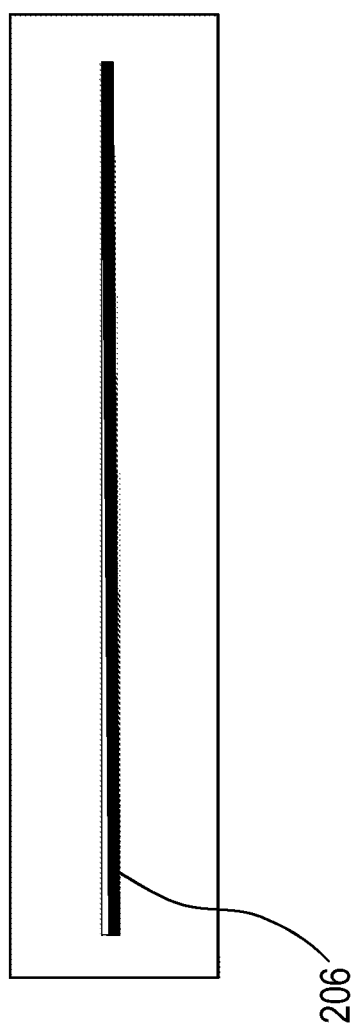
Figure 5:
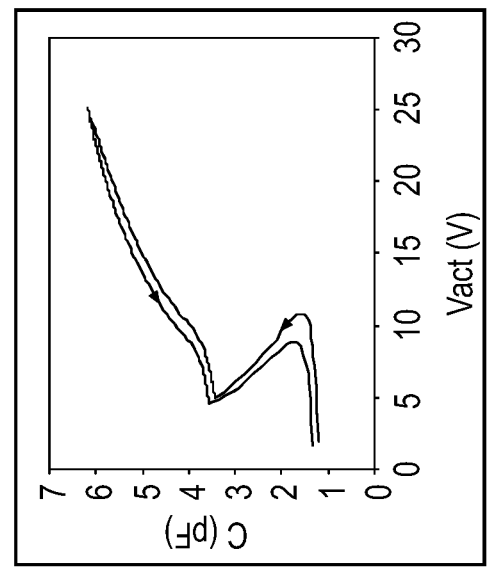

The following description will turn to FIGS. 2 to 6 in parallel. FIGS. 2 to 4 show, as a proof of concept the result of finite element simulation of an electrostatically actuated double clamped beam at different states. FIGS. 5 and 6 are diagrams showing the dependence of the capacitance of a MEMS device on a voltage applied to a deformation electrode in the configuration of FIGS. 2 to 4.

The FIGS. 2 to 6 represent a proof of concept, which was achieved by finite element simulations of an electrostatically actuated doubled-clamped beam, which corresponds to the suspension structures 108. The material parameters used were: the beam is made of a material that has a Young's modulus Y=70 GPa, the Poisson ratio ν=0.33, yield stress=30 MPaAluminum, beam length=390 micrometer, beam width=400 micrometer, beam thickness=2.6 micrometer, gap (distance to bottom electrode)=1 micrometer, and, as a dielectric layer, 1 micrometer of SiN. For the simulations, an isotropic hardening model was used with a tangent modulus $E_{Tiso}$=25 MPa. A continuous bottom electrode and ideal clamping is assumed.

Note that some of the mentioned material parameters deviate somewhat from those of aluminum (Al). However, a qualitatively equal and equally useful result is derived when using the actual yield stress and tangent modulus of aluminum.

The beam 206 of the simulation is shown in FIG. 2 in its original off-state position. FIG. 3 shows the shape of the beam 206 when an actuation voltage of 25 V is applied to the bottom electrode (not shown in FIGS. 2 to 4). As can be seen, the beam is plastically deformed and moved from its off-state position by approximately 1 micrometer.

Note that only half of the lateral extension of the beam is shown in FIGS. 2 to 4. The behavior of the other half that is not shown in these Figures corresponds to that of the section shown, only with mirrored sections.

FIG. 4 shows the beam of FIGS. 2 and 3 after reducing the actuation voltage from 25 V back to 0 V. Again, the actual shape of the beam 206 is shown in comparison with its original shape, which is that of FIG. 2. As can clearly be seen, the beam has been plastically deformed and does not return to its initial position.

This behavior is also reflected in FIGS. 5 and 6 in both diagrams, the open capacitance C of the capacitor structure used for the simulation and described in the context of FIGS. 2 to 4 is calculated as a function of the actuation voltage $V_{act}$ during a voltage cycle that goes from 0 V to 25 V and back to 0 V. The direction of the cycling is indicated in the curves of FIGS. 5 and 6 by arrows. For the purpose of the present discussion, it is most important that after an application of 25 V the capacitance curve of the structure is shifted to higher capacitance values in comparison with the up-sweep of the actuation voltage. This effect is even stronger visible in the case, where the maximum actuation voltage is 30 V. In this case, after returning to 0 V, the open capacitance is approximately 1.8 pF in comparison with approximately 1.2 pF before the voltage cycle.

Figure 9:
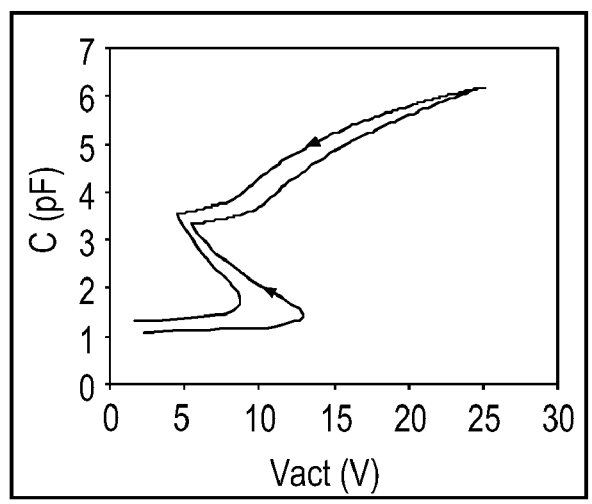
FIG. 9 shows a diagram similar to that of FIGS. 5 and 6 for the configuration shown in FIGS. 7 and 8.

FIGS. 7 and 8 show another proof of concept the result of finite element simulation of an electrostatically actuated double claimed beam at different states. FIG. 9 shows a diagram similar to that of FIGS. 5 and 6 for the configuration shown in FIGS. 7 and 8.

The basic parameters of the simulation underlying the graphical representations of FIGS. 7 to 9 are identical to those used for FIGS. 2 to 6. However, in contrast to the case of FIG. 2, it is assumed for the present case, that the beam 206 is initially plastically deformed. This might be due to processing or operation conditions that have been described earlier. FIG. 8 shows the position of the beam 206 after a voltage cycle that leads from 0 V to 25 V and back to 0 V. As can be seen from a comparison of FIGS. 8 and 4, the plastic deformation of the beam 206 after the voltage cycle is virtually identical. This means that the plastic deformation after the voltage cycle is to a certain extend independent from the initial plastic deformation. I.e., it does not matter for the final plastic deformation whether the beam 206 was initially in a plastically deformed shape or not. This effect forms the basis for the elimination of initial deformations due to variations in the fabrication process between different devices. Independent of what the initial deformation was, they can all be brought to the same deformation state by applying a suitable deformation voltage.

Figure 10:
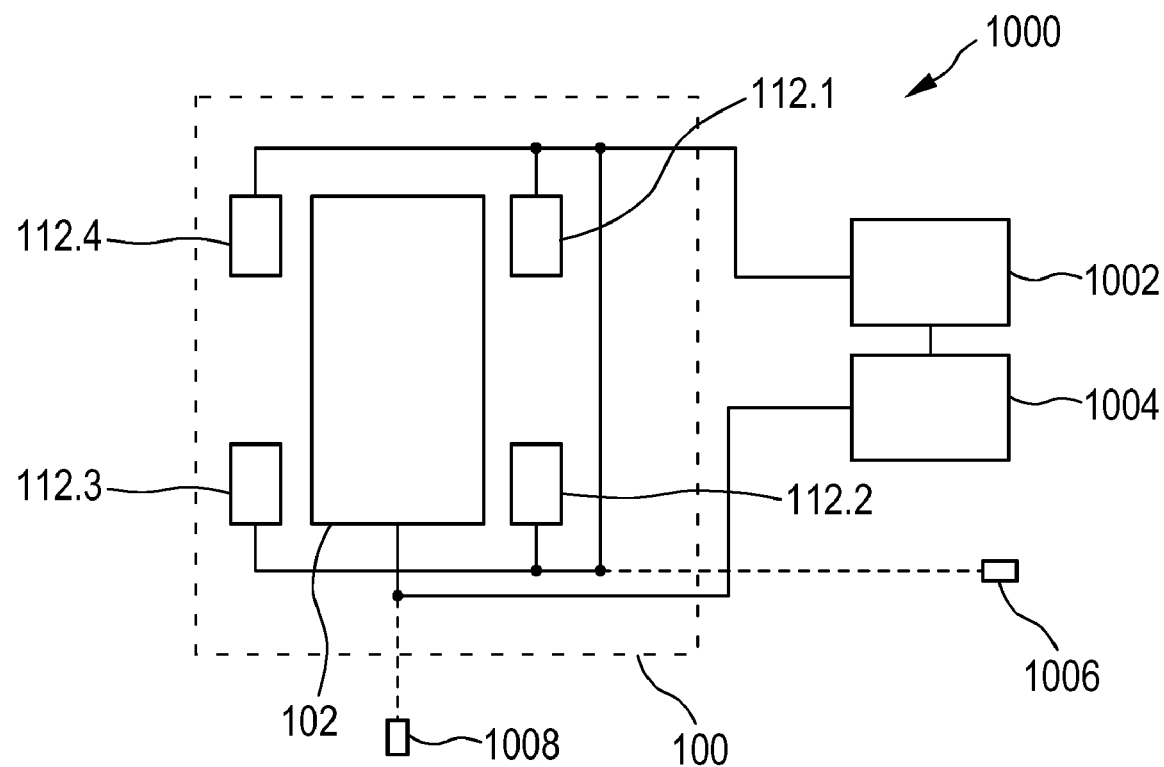
FIG. 10 shows a schematic diagram of an electronic device according to an embodiment of the invention.

FIG. 10 shows a schematic diagram of an electronic device 1000 according to an embodiment of the invention. The simplified block diagram of FIG. 10 is based on the embodiment of FIG. 1 and uses the same switching schema for the bottom electrode 102 and the deformation electrodes 112.1 to 112.4. In addition, the electronic device 1000 has a deformation-control unit 1002. The deformation-control unit 1002 is connected with the deformation-electrodes 112.1 to 112.4. It is configured to generate and provide a deformation voltage to the deformation electrodes 112.1 to 112.4.

The electronic device of FIG. 10 further contains a measurement unit 1004, which is connected with the first electrode and the second electrode (connection to the second electrode not shown in FIG. 10 for simplicity of graphical representation) and configured to ascertain a value of a first quantity that is dependent on an off-state capacitance of the arrangement formed by the bottom electrode 102 and the top electrode 106 in their off-state positions, i.e. when no switching voltage is applied. The voltage amount of the deformation voltage is in one embodiment preset to a fixed value. In this embodiment, the measurement unit 1004 is not required. The operation of the electronic device 1000 of FIG. 10 will next be described with reference to FIG. 11.

Figure 11:
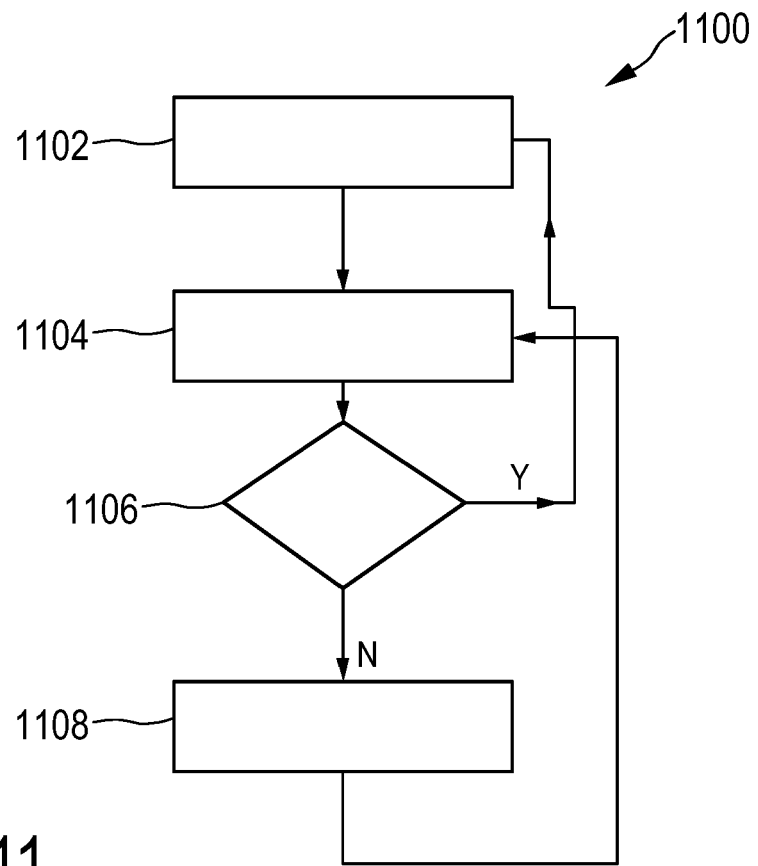
FIG. 11 shows an embodiment of a method for operating an electronic device.

FIG. 11 shows an embodiment of a method for operating an electronic device. The operating method 1100 of FIG. 11 has a first step 1102, during which the MEMS device is operated. During a next step, the measurement unit 1104 ascertains a value of a first quantity that is dependent on an off-state capacitance of the arrangement formed by the bottom and top electrodes 102 and 106. The first quantity is for instance the pull-in voltage. The result of the measurement is compared in a step 1106 with a desired target value. If it is equal to the target value or within a predefined deviation interval from the target value, the operation of the MEMS device continuous at step 1102. If it deviates from the target value a deformation voltage is applied in a step 1108, after which the measurement step 1104 is repeated. In case the target value still have not been reached, the step of applying the target voltage can be repeated with an increased deformation voltage. In case the target value has been reached after the step of applying the deformation voltage, normal operation continuous at step 1102.

A short description of the flow diagram of FIG. 11 is as follows:
  Step 1102: Operate MEMS device
  Step 1104: Ascertain open capacitance
  Step 1106: Ascertained open capacitance=target?
  Step 1108: Apply deformation voltage.

Figure 12:
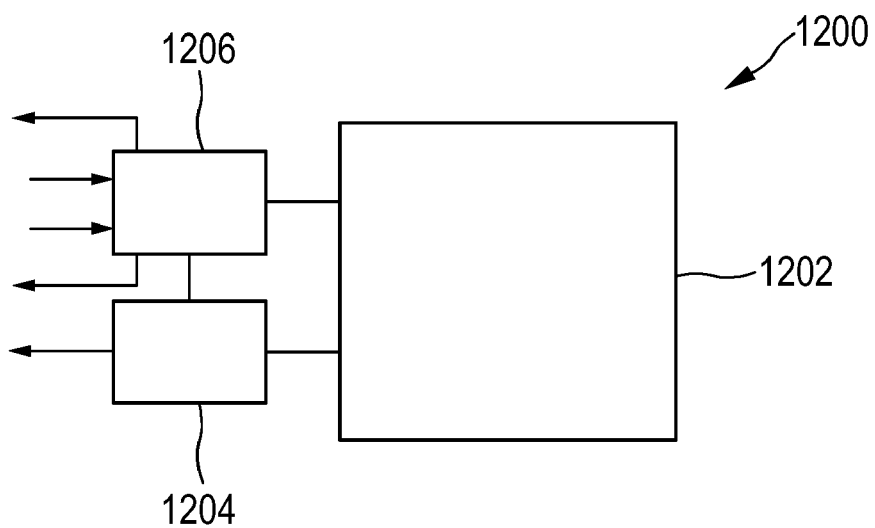
FIG. 12 shows an embodiment of a tuning device.

FIG. 12 is a simplified block diagram that shows an embodiment of a tuning device. The tuning device 1200 of FIG. 12 has a deformation-control unit 1202, which incorporates the functionalities of both, the deformation-control unit 1002 and the measurement unit 1004 of the electronic circuit of electronic device of FIG. 10. However, the tuning device is a separate device that is used during fabrication of an electronic device or of a MEMS device in order to tune the off-state position of the top-electrode, and thus, the open capacitance and the pull-in voltage of the MEMS device. An output unit 1204 is provided, which is configured to apply the deformation electrode generated by the deformation-control unit to a pin or contact pad of a packaged electronic device like the electronic device of FIG. 10. A measurement interface 1206 is provided, which serves for connection to the first and second electrodes for applying a voltage between them, and has corresponding inputs for detecting the response of the MEMS device during the measurement of the pull-in voltage. Note that the functionality of measuring the open capacitance by means of the pull-in voltage need not be provided in the tuning device of FIG. 12. It can also be omitted. There are also other ways for measuring the open capacitance.

Figure 13:
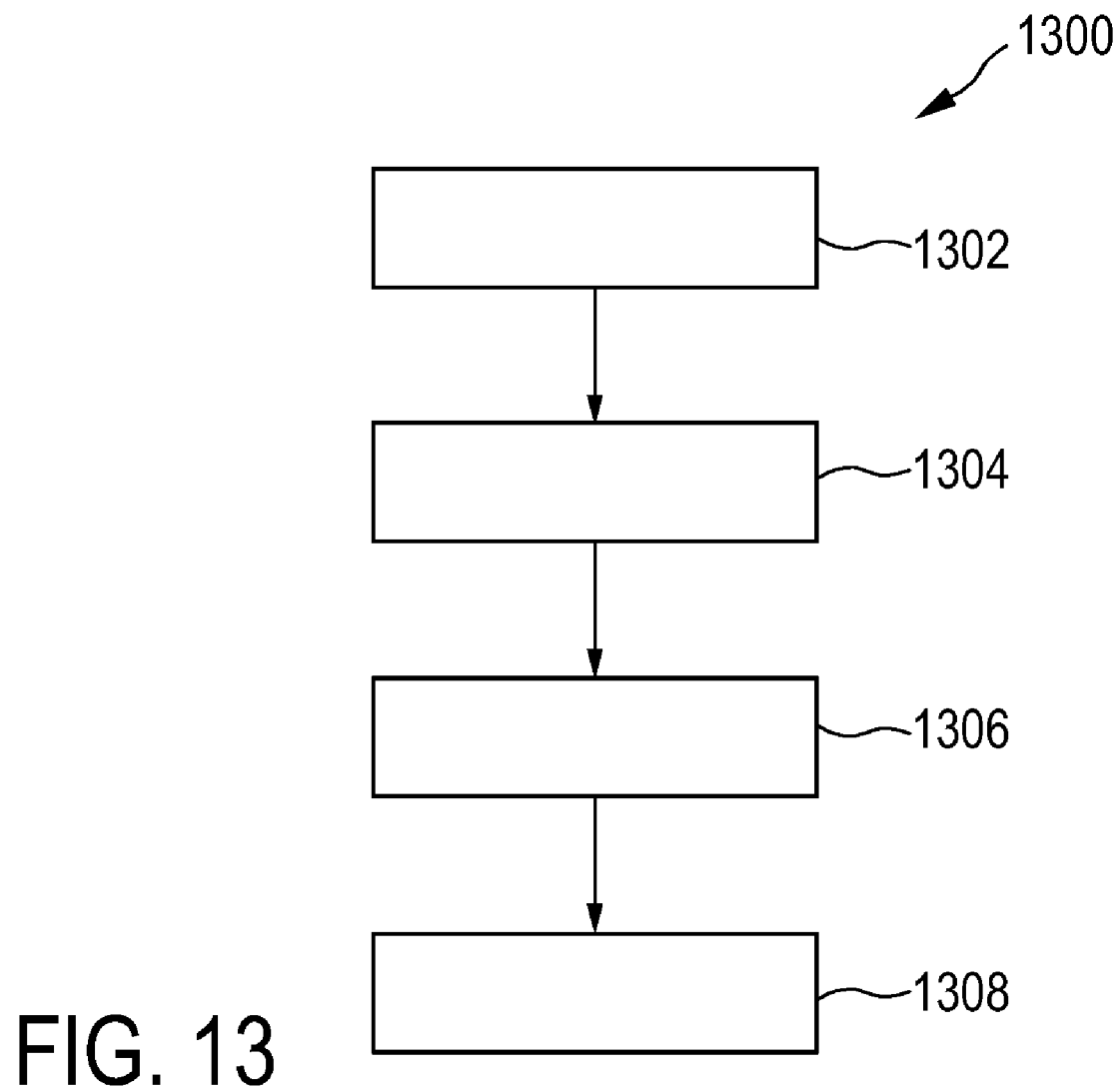
FIG. 13 shows an embodiment of a method for fabricating a MEMS device according to an embodiment of the invention.

FIG. 13 shows a fabrication method for an electronic device. The fabrication method 1300 has a first step 1302 during which the MEMS device and the electronic circuitry of the electronic device are fabricated. This can be performed using known processing techniques. After step 1302, the electronic device is provided in the form of a chip or a number of chips connected with each other. The chip or chips are then packaged in a step 1304. In an optional step 1306, the open capacitance or pull-in voltage of the electronic circuit is measured. In this step, it can be determined whether the fabricated device is suitable for operation at all. Unsuitable devices can be sorted out after step 1306. If the device is determined to be suitable it is forwarded to the tuning device, which applies the deformation voltage to the deformation electrodes for tuning the off-state position of the top electrode.

A short description of the method of FIG. 13 is as follows:
  Step 1302: Fabricate MEMS device and circuits
  Step 1304: Package
  Step 1306: Ascertain open capacitance
  Step 1308: Apply deformation voltage While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage.

Any reference signs in the claims should not be construed as limiting the scope.

The invention claimed is:

1. A Micro Electro Mechanical System (MEMS) device comprising:
   a first electrode on a substrate;
   a second electrode, which in an off-state position, in which no switching force is applied to the second electrode, is suspended with a distance to the first electrode with the aid of a suspension structure, and which is elastically switchable to an on-state position upon application of a switching force via the first electrode; and
   at least one deformation electrode, wherein at least one of the second electrode and the suspension structure is plastically deformable upon application of an electrostatic deformation force via the at least one deformation electrode to at least one of the second electrode and the suspension structure.

2. The MEMS device of claim 1, wherein the suspension structure comprises at least one spring, and the at least one spring is plastically deformable upon application of the electrostatic deformation force via the at least one deformation electrode.

3. The MEMS device of claim 2, wherein springs respectively correspond to a number of deformation electrodes in a one-to-one configuration.

4. The MEMS device of claim 2, wherein the springs comprise aluminum.

5. The MEMS device of claim 4, wherein the springs are formed by U-shaped aluminum sheets.

6. The MEMS device of claim 1, wherein the second electrode has a yield stress that can be lowered by exposure to thermal energy.

7. The MEMS device of claim 1, further comprising:
   at least one deformation-control contact element, which is connected with the at least one deformation electrode for connecting the at least one deformation electrode with an external tuning device.

8. The MEMS device of claim 1, further comprising:
   two capacitance-measurement contact elements, which are connected with the first electrode and the second electrode, respectively, for connecting the first electrode and the second electrode with an external measurement device for ascertaining a first quantity that is dependent on an off-state-capacitance of an arrangement formed by the first and second electrodes in the off-state position.

9. An electronic device comprising a MEMS device according to claim 1 connected with an integrated circuit.

10. The electronic device of claim 9, further comprising: a deformation-control unit, which is connected with the at least one deformation electrode and configured to generate and provide a deformation voltage to the at least one deformation electrode.

11. The electronic device of claim 9, further comprising: a deformation-control unit, which is connected with the first electrode and the second electrode and configured to ascertain a value of a first quantity that is dependent on an off-state capacitance of an arrangement formed by the first and second electrodes in the off-state position.

12. The MEMS device of claim 11, wherein the deformation-control unit sets a deformation voltage in proportion to a difference between a target value of the first quantity and the ascertained value of the first quantity.

13. A method for fabricating the MEMS device of claim 1, the method comprising:
applying a deformation voltage to the at least one deformation electrode, thus plastically deforming the second electrode, until the second electrode reaches a target off-state position.

14. A method for operating the electronic device of claim 13, the method comprising:
applying a deformation voltage to the at least one deformation electrode, thus plastically deforming the second electrode of the MEMS device, until a target value is reached.

15. The MEMS device of claim 1, wherein the second electrode is made of a single layer.

16. The MEMS device of claim 1, wherein the suspension structure has a rectangular U-shape.

17. A tuning device for tuning an off-state position of a suspended electrode of a Micro Electro Mechanical System (MEMS) device, the tuning device comprising:
a deformation-control unit, connected to first and second electrodes of the MEMS device, which is configured to ascertain a value of a first quantity that is dependent on an off-state capacitance of an arrangement formed by first and second electrodes of the MEMS device in the off-state position and to generate a predetermined deformation voltage; and
an output unit, which is configured to provide the generated deformation voltage to an external deformation-control contact element of the MEMS device, wherein the predetermined deformation voltage is sufficient to cause plastic deformation of at least one of the second electrode and the external deformation-control contact element.

18. A Micro Electro Mechanical System (MEMS) device comprising:
a first electrode on a substrate;
a second electrode, which in an off-state position, in which no switching force is applied to the second electrode, is suspended with a distance to the first electrode with the aid of a suspension structure, and which is elastically switchable to an on-state position upon application of a switching force via the first electrode, wherein the second electrode has a yield stress that can be lowered by exposure to thermal energy; and
at least one deformation electrode, wherein at least one of the second electrode and the suspension structure is plastically deformable upon application of an electrostatic deformation force via the at least one deformation electrode to at least one of the second electrode and the suspension structure.

* * * * *